(12) United States Patent
Carcano et al.

(10) Patent No.: US 11,444,588 B2
(45) Date of Patent: Sep. 13, 2022

(54) COPPER WIRE BOND SOLUTION FOR REDUCING THERMAL STRESS ON AN INTERMITTENTLY OPERABLE CHIPSET CONTROLLING RF APPLICATION FOR COOKING

(71) Applicant: Illinois Tool Works Inc., Glenview, IL (US)

(72) Inventors: Marco Carcano, Senago (IT); Daniele Chirico, Brugherio (IT); Michele Sclocchi, San Donato Milanese (IT)

(73) Assignee: Illinois Tool Works Inc., Glenview, IL (US)

( * ) Notice: Subject to any disclaimer, the term of this patent is extended or adjusted under 35 U.S.C. 154(b) by 323 days.

(21) Appl. No.: 16/686,471

(22) Filed: Nov. 18, 2019

(65) Prior Publication Data

US 2020/0162036 A1    May 21, 2020

Related U.S. Application Data

(60) Provisional application No. 62/769,187, filed on Nov. 19, 2018.

(51) Int. Cl.
*H03F 3/193*     (2006.01)
*H05B 6/68*     (2006.01)
(Continued)

(52) U.S. Cl.
CPC ....... *H03F 3/193* (2013.01); *H01L 23/53228* (2013.01); *H01L 23/66* (2013.01);
(Continued)

(58) Field of Classification Search
CPC .............................. H05B 6/687; H03F 3/193
See application file for complete search history.

(56) References Cited

U.S. PATENT DOCUMENTS 3,953,702 A * 4/1976 Bickel ................... H03B 7/146
219/761
2006/0138654 A1 6/2006 Yoshida
(Continued)

FOREIGN PATENT DOCUMENTS

| WO | 2006067705 A1 | 6/2006 |
| WO | 2015028839 A1 | 3/2015 |
| WO | 2018142176 A1 | 8/2018 |

OTHER PUBLICATIONS

International Search Report and Written Opinion dated Nov. 19, 2019 from International Application No. PCT/US2019/062144, all pages cited in it's entirety.

*Primary Examiner* — Patricia T Nguyen
(74) *Attorney, Agent, or Firm* — Burr & Forman LLP

(57) ABSTRACT

Power amplifier electronics for controlling application of radio frequency (RF) energy generated using solid state electronic components may further be configured to control application of RF energy in cycles between high and low powers. The power amplifier electronics may include a semiconductor die on which one or more RF power transistors are fabricated, an output matching network configured to provide impedance matching between the semiconductor die and external components operably coupled to an output tab, and bonding wires bonded at terminal ends thereof to operably couple the one or more RF power transistors of the semiconductor die to the output matching network. The bonding wires may be copper bonding wires having a diameter of between about 10 microns and about 100 microns.

20 Claims, 8 Drawing Sheets

(51) Int. Cl.
*H01L 23/532* (2006.01)
*H01L 23/66* (2006.01)
*H03F 3/21* (2006.01)

(52) U.S. Cl.
CPC ............... *H03F 3/21* (2013.01); *H05B 6/687* (2013.01); *H03F 2200/387* (2013.01)

(56) References Cited

U.S. PATENT DOCUMENTS

| | | | | |
|---|---|---|---|---|
| 2011/0031237 | A1* | 2/2011 | Bilchinsky | G06Q 30/04 219/679 |
| 2012/0032190 | A1 | 2/2012 | Takagi | |
| 2014/0346637 | A1* | 11/2014 | Komposch | H01L 23/34 257/532 |
| 2016/0071777 | A1* | 3/2016 | Yahata | H01L 23/36 257/690 |
| 2020/0205245 | A1* | 6/2020 | Ma | H05B 6/50 |
| 2020/0389949 | A1* | 12/2020 | Hua | H05B 6/6432 |

* cited by examiner

COPPER WIRE BOND SOLUTION FOR REDUCING THERMAL STRESS ON AN INTERMITTENTLY OPERABLE CHIPSET CONTROLLING RF APPLICATION FOR COOKING

CROSS REFERENCE TO RELATED APPLICATIONS

The present application claims priority to U.S. Provisional Application No. 62/769,187 filed on Nov. 19, 2018, the contents of which are incorporated herein by reference in its entirety.

TECHNICAL FIELD

Example embodiments generally relate to ovens and, more particularly, relate to an oven that uses radio frequency (RF) heating provided by solid state electronic components and solutions for the protection of oven components.

BACKGROUND

Combination ovens that are capable of cooking using more than one heating source (e.g., convection, steam, microwave, etc.) have been in use for decades. Each cooking source comes with its own distinct set of characteristics. Thus, a combination oven can typically leverage the advantages of each different cooking source to attempt to provide a cooking process that is improved in terms of time and/or quality. More recently, ovens with improved capabilities relative to cooking food with a combination of controllable RF energy and convection energy have been introduced. Unlike the relatively indiscriminate bombarding of food product, which generally occurs in microwave cooking, the use of controllable RF energy can enable a much more fine-tuned control of the cooking process. This fine-tuned control of the cooking process can lead to superior results in vastly shortened time periods.

Of course, RF applications have been speedily developing in other technical areas also for decades. Accordingly, it should be no surprise that the lessons, and various components and assemblies that were used in other technical areas would be applied in the area of RF cooking as this new area of technology began to develop. However, the use of well proven components from other RF applications, particularly in relation to the power amplifier electronics components, resulted in a surprising number of failures of such components. In this regard, for example, power amplifier electronics components that had been employed at high powers on a nearly continuous basis in other applications were unexpectedly failing when transferred to the oven environment where the demands on their performance seemingly decreased.

Upon investigation, the solution to the mystery of why these normally robust components were failing in what would otherwise seem to be less challenging operational circumstances than they normally face seemed straightforward. However, as will be discussed in greater detail below, the apparently straightforward solution was not the panacea expected. Accordingly, example embodiments take a relatively counterintuitive approach to connecting components within the power amplifier electronics.

BRIEF SUMMARY OF SOME EXAMPLES

In an example embodiment, an oven is provided. The oven may include a cooking chamber configured to receive a food product, and an RF heating system configured to provide RF energy into the cooking chamber using solid state electronic components. The solid state electronic components include power amplifier electronics configured to provide a signal into the cooking chamber via a launcher assembly operably coupled to the cooking chamber via a waveguide assembly. The power amplifier electronics may be configured to control application of RF energy into the cooking chamber at least in part based on a learning procedure that generates a power cycling between high and low powers when the learning procedure is executed. The power amplifier electronics may include a semiconductor die on which one or more RF power transistors are fabricated, an output matching network configured to provide impedance matching between the semiconductor die and external components operably coupled to an output tab, and bonding wires bonded at terminal ends thereof to operably couple the one or more RF power transistors of the semiconductor die to the output matching network. The bonding wires may include copper bonding wires having a diameter of between about 10 microns and about 100 microns.

In another example embodiment, power amplifier electronics for controlling application of RF energy generated using solid state electronic components may be provided. The power amplifier electronics may be configured to control application of the RF energy in cycles between high and low powers. The power amplifier electronics may include a semiconductor die on which one or more RF power transistors are fabricated, an output matching network configured to provide impedance matching between the semiconductor die and external components operably coupled to an output tab, and bonding wires bonded at terminal ends thereof to operably couple the one or more RF power transistors of the semiconductor die to the output matching network. The bonding wires may be copper bonding wires having a diameter of between about 10 microns and about 100 microns.

In another example embodiment, a method of coupling components in power amplifier electronics is provided. The method may include providing a semiconductor die on which one or more RF power transistors are fabricated within a package of power amplifier electronics configured to control application of radio frequency (RF) energy generated using solid state electronic components, where the power amplifier electronics are configured to control application of RF energy in cycles between high and low powers. The method may further include providing an output matching network configured to provide impedance matching between the semiconductor die and external components operably coupled to an output tab of the package proximate to the semiconductor die, and operably coupling the one or more RF power transistors of the semiconductor die to the output matching network via copper bonding wires. The copper bonding wires may have terminal ends thereof that are bonded to a respective one of the one or more RF power transistors of the semiconductor die and the output matching network. The bonding wires may include copper bonding wires having a diameter of between about 10 microns and about 100 microns.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

DETAILED DESCRIPTION

Figure 1:
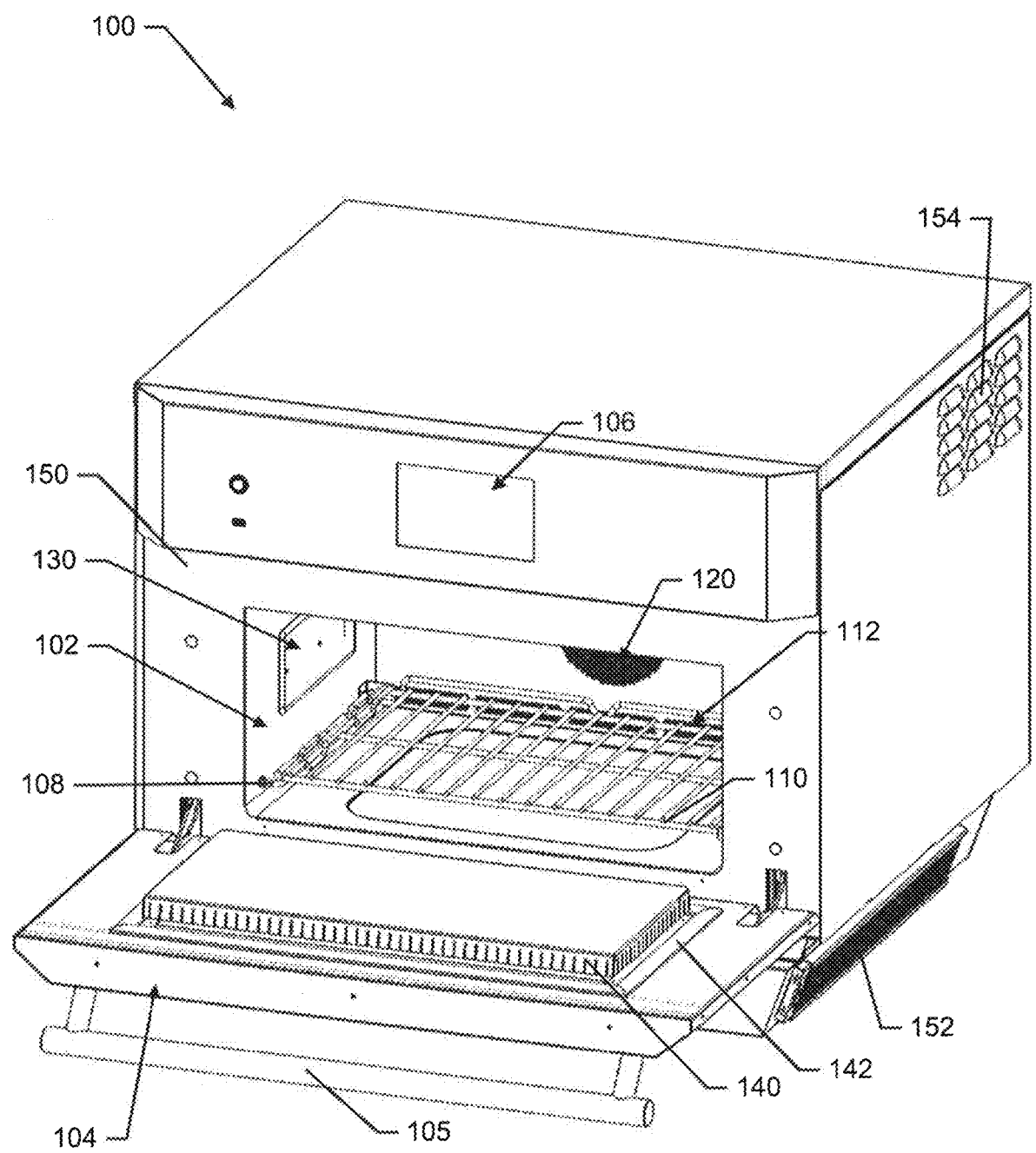
FIG. 1 illustrates a perspective view of an oven capable of employing at least two energy sources according to an example embodiment.

Some example embodiments now will be described more fully hereinafter with reference to the accompanying drawings, in which some, but not all example embodiments are shown. Indeed, the examples described and pictured herein should not be construed as being limiting as to the scope, applicability or configuration of the present disclosure. Rather, these example embodiments are provided so that this disclosure will satisfy applicable legal requirements. Like reference numerals refer to like elements throughout. Furthermore, as used herein, the term "or" is to be interpreted as a logical operator that results in true whenever one or more of its operands are true. As used herein, operable coupling should be understood to relate to direct or indirect connection that, in either case, enables functional interconnection of components that are operably coupled to each other.

Some example embodiments may improve the cooking performance of an oven and/or may improve the operator experience of individuals employing an example embodiment. In this regard, the oven may cook food relatively quickly and uniformly, based on the application of RF energy under the instruction of control electronics that are configured to employ protective strategies and structures to prevent damage to the control electronics as described herein.

As noted above, power amplifier electronics components that had been employed at high powers on a nearly continuous basis in other technology areas involving RF power amplifiers were unexpectedly failing in the oven environment. This was surprising since the oven environment did not require continuous operation of these components due to the fact that, as will be discussed in greater detail below, the oven cycles between high and low powers. However, upon further investigation it was determined that the connecting wires coupling high power RF sections with microwave transistors as part of impedance matching networks internal to the power amplifier electronics were the primary source of failures. The initial thought to cure this issue was to increase the size of the connecting wires and the bonding at the landing pads of components they operably couple to make them more robust relative to tolerance of the power swings associated with the thermal stresses caused by oven cycles between high and low powers. However, this intuitive solution was also ineffective since the larger sizes actually caused resonant frequencies at the frequencies of operation, which caused increased thermal stress for power cycling applications. Accordingly, a somewhat counterintuitive approach of using a small wire size of a different material along with other structural changes improved performance due to less thermal stress generation at the resonant frequencies generated during normal operation. Further specific examples describing this solution will be discussed below in reference to FIGS. 6 and 7. However, first a further description of the environmental context in which this problem arose will be discussed in reference to FIGS. 1-5.

FIG. 1 illustrates a perspective view of an oven 100 according to an example embodiment. As shown in FIG. 1, the oven 100 may include a cooking chamber 102 into which a food product may be placed for the application of heat by any of at least two energy sources that may be employed by the oven 100. The cooking chamber 102 may include a door 104 and an interface panel 106, which may sit proximate to the door 104 when the door 104 is closed. The door 104 may be operable via handle 105, which may extend across the front of the oven 100 parallel to the ground. In some cases, the interface panel 106 may be located substantially above the door 104 (as shown in FIG. 1) or alongside the door 104 in alternative embodiments. In an example embodiment, the interface panel 106 may include a touch screen display capable of providing visual indications to an operator and further capable of receiving touch inputs from the operator. The interface panel 106 may be the mechanism by which instructions are provided to the operator, and the mechanism by which feedback is provided to the operator regarding cooking process status, options and/or the like.

In some embodiments, the oven 100 may include multiple racks or may include rack (or pan) supports 108 or guide slots in order to facilitate the insertion of one or more racks 110 or pans holding food product that is to be cooked. In an example embodiment, air delivery orifices 112 may be positioned proximate to the rack supports 108 (e.g., just below a level of the rack supports in one embodiment) to enable heated air to be forced into the cooking chamber 102 via a heated-air circulation fan (not shown in FIG. 1). The heated-air circulation fan may draw air in from the cooking chamber 102 via a chamber outlet port 120 disposed at a back or rear wall (i.e., a wall opposite the door 104) of the cooking chamber 102. Air may be circulated from the chamber outlet port 120 back into the cooking chamber 102 via the air delivery orifices 112. After removal from the cooking chamber 102 via the chamber outlet port 120, air may be cleaned, heated, and pushed through the system by other components prior to return of the clean, hot and speed controlled air back into the cooking chamber 102. This air circulation system, which includes the chamber outlet port 120, the air delivery orifices 112, the heated-air circulation fan, cleaning components, and all ducting therebetween, may form a first air circulation system within the oven 100.

In an example embodiment, food product placed on a pan or one of the racks 110 (or simply on a base of the cooking chamber 102 in embodiments where racks 110 are not employed) may be heated at least partially using radio frequency (RF) energy. Meanwhile, the airflow that may be provided may be heated to enable further heating or even browning to be accomplished. Of note, a metallic pan may be placed on one of the rack supports 108 or racks 110 of some example embodiments. However, the oven 100 may be configured to employ frequencies and/or mitigation strategies for detecting and/or preventing any arcing that might otherwise be generated by using RF energy with metallic components.

In an example embodiment, the RF energy may be delivered to the cooking chamber 102 via an antenna assembly 130 disposed proximate to the cooking chamber 102. In some embodiments, multiple components may be provided in the antenna assembly 130, and the components may be placed on opposing sides of the cooking chamber 102. The antenna assembly 130 may include one or more instances of a power amplifier, a launcher, waveguide and/or the like that are configured to couple RF energy into the cooking chamber 102.

The cooking chamber 102 may be configured to provide RF shielding on five sides thereof (e.g., the top, bottom, back, and right and left sides), but the door 104 may include a choke 140 to provide RF shielding for the front side. The choke 140 may therefore be configured to fit closely with the opening defined at the front side of the cooking chamber 102 to prevent leakage of RF energy out of the cooking chamber 102 when the door 104 is shut and RF energy is being applied into the cooking chamber 102 via the antenna assembly 130.

In an example embodiment, a gasket 142 may be provided to extend around the periphery of the choke 140. In this regard, the gasket 142 may be formed from a material such as wire mesh, rubber, silicon, or other such materials that may be somewhat compressible between the door 104 and a periphery of the opening into the cooking chamber 102. The gasket 142 may, in some cases, provide a substantially air tight seal. However, in other cases (e.g., where the wire mesh is employed), the gasket 142 may allow air to pass therethrough. Particularly in cases where the gasket 142 is substantially air tight, it may be desirable to provide an air cleaning system in connection with the first air circulation system described above.

The antenna assembly 130 may be configured to generate controllable RF emissions into the cooking chamber 102 using solid state components. Thus, the oven 100 may not employ any magnetrons, but instead use only solid state components for the generation and control of the RF energy applied into the cooking chamber 102. The use of solid state components may provide distinct advantages in terms of allowing the characteristics (e.g., power/energy level, phase and frequency) of the RF energy to be controlled to a greater degree than is possible using magnetrons. However, since relatively high powers are necessary to cook food, the solid state components themselves will also generate relatively high amounts of heat, which must be removed efficiently in order to keep the solid state components cool and avoid damage thereto. To cool the solid state components, the oven 100 may include a second air circulation system.

The second air circulation system may operate within an oven body 150 of the oven 100 to circulate cooling air for preventing overheating of the solid state components that power and control the application of RF energy to the cooking chamber 102. The second air circulation system may include an inlet array 152 that is formed at a bottom (or basement) portion of the oven body 150. In particular, the basement region of the oven body 150 may be a substantially hollow cavity within the oven body 150 that is disposed below the cooking chamber 102. The inlet array 152 may include multiple inlet ports that are disposed on each opposing side of the oven body 150 (e.g., right and left sides when viewing the oven 100 from the front) proximate to the basement, and also on the front of the oven body 150 proximate to the basement. Portions of the inlet array 152 that are disposed on the sides of the oven body 150 may be formed at an angle relative to the majority portion of the oven body 150 on each respective side. In this regard, the portions of the inlet array 152 that are disposed on the sides of the oven body 150 may be tapered toward each other at an angle of about twenty degrees (e.g., between ten degrees and thirty degrees). This tapering may ensure that even when the oven 100 is inserted into a space that is sized precisely wide enough to accommodate the oven body 150 (e.g., due to walls or other equipment being adjacent to the sides of the oven body 150), a space is formed proximate to the basement to permit entry of air into the inlet array 152. At the front portion of the oven body 150 proximate to the basement, the corresponding portion of the inlet array 152 may lie in the same plane as (or at least in a parallel plane to) the front of the oven 100 when the door 104 is closed. No such tapering is required to provide a passage for air entry into the inlet array 152 in the front portion of the oven body 150 since this region must remain clear to permit opening of the door 104.

From the basement, ducting may provide a path for air that enters the basement through the inlet array 152 to move upward (under influence from a cool-air circulating fan) through the oven body 150 to an attic portion inside which control electronics (e.g., the solid state components) are located. The attic portion may include various structures for ensuring that the air passing from the basement to the attic and ultimately out of the oven body 150 via outlet louvers 154 is passed proximate to the control electronics to remove heat from the control electronics. Hot air (i.e., air that has removed heat from the control electronics) is then expelled from the outlet louvers 154. In some embodiments, outlet louvers 154 may be provided at right and left sides of the oven body 150 and at the rear of the oven body 150 proximate to the attic. Placement of the inlet array 152 at the basement and the outlet louvers 154 at the attic ensures that the normal tendency of hotter air to rise will prevent recirculation of expelled air (from the outlet louvers 154) back through the system by being drawn into the inlet array 152. Furthermore, the inlet array 152 is at least partially shielded from any direct communication path from the outlet louvers 154 by virtue of the fact that, at the oven sides (which include both portions of the inlet array 152 and outlet louvers 154), the shape of the basement is such that the tapering of the inlet array 152 is provided on walls that are also slightly inset to create an overhang 158 that blocks any air path between inlet and outlet. As such, air drawn into the inlet array 152 can reliably be expected to be air at ambient room temperature, and not recycled, expelled cooling air.

Figure 2:
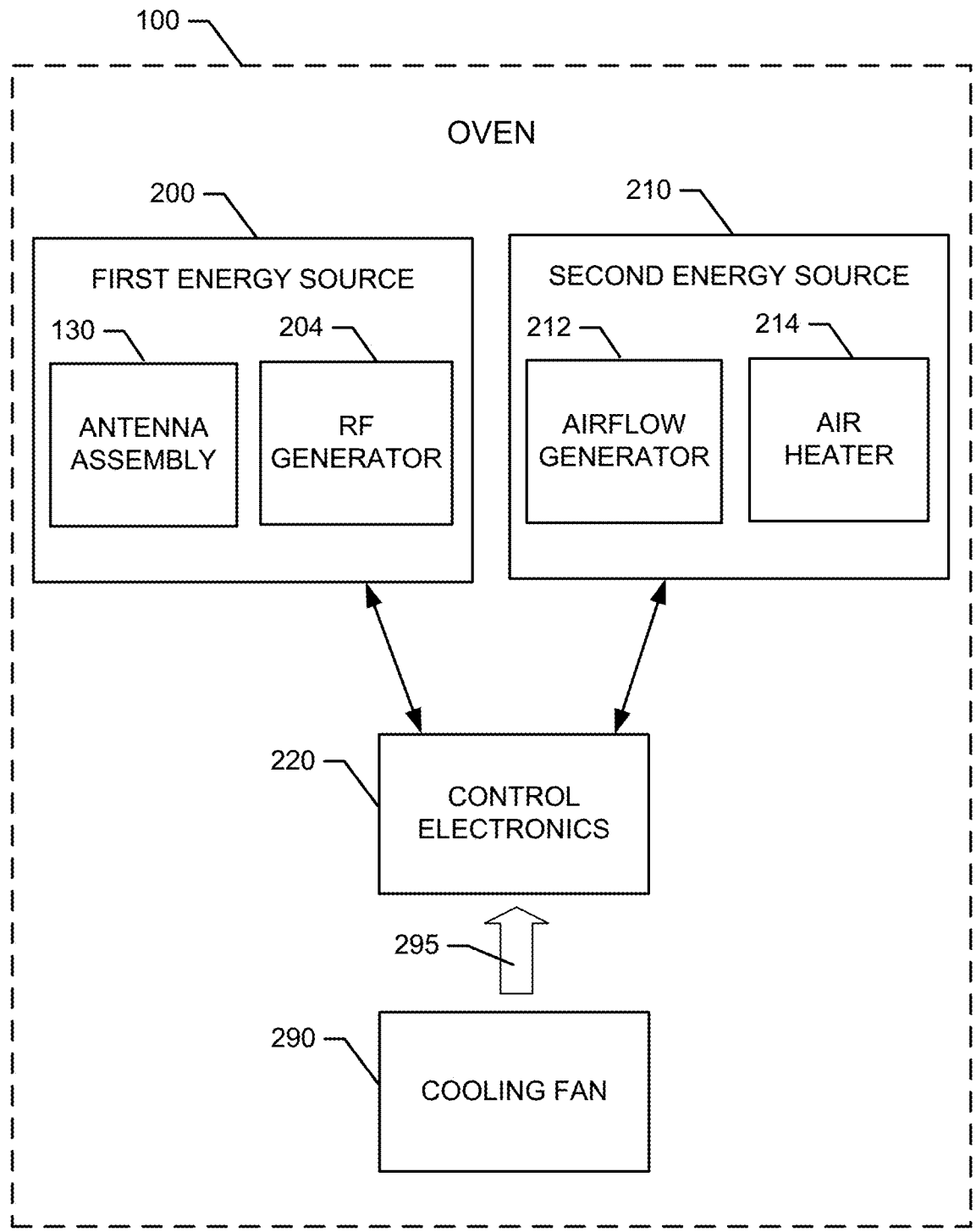
FIG. 2 illustrates a functional block diagram of the oven of FIG. 1 according to an example embodiment.

FIG. 2 illustrates a functional block diagram of the oven 100 according to an example embodiment. As shown in FIG. 2, the oven 100 may include at least a first energy source 200 and a second energy source 210. The first and second energy sources 200 and 210 may each correspond to respective different cooking methods. In some embodiments, the first and second energy sources 200 and 210 may be an RF heating source and a convective heating source, respectively. However, it should be appreciated that additional or alternative energy sources may also be provided in some embodiments. Moreover, some example embodiments could be practiced in the context of an oven that includes only a single energy source (e.g., the second energy source 210). As such, example embodiments could be practiced on otherwise conventional ovens that apply heat using, for example, gas or electric power for heating.

As mentioned above, the first energy source 200 may be an RF energy source (or RF heating source) configured to generate relatively broad spectrum RF energy or a specific narrow band, phase controlled energy source to cook food product placed in the cooking chamber 102 of the oven 100. Thus, for example, the first energy source 200 may include the antenna assembly 130 and an RF generator 204. The RF generator 204 of one example embodiment may be configured to generate RF energy at selected levels and with selected frequencies and phases. In some cases, the frequencies may be selected over a range of about 6 MHz to 246 GHz. However, other RF energy bands may be employed in some cases. In some examples, frequencies may be selected from unlicensed frequency (e.g., the ISM) bands for application by the RF generator 204.

In some cases, the antenna assembly 130 may be configured to transmit the RF energy into the cooking chamber 102 and receive feedback to indicate absorption levels of respective different frequencies in the food product. The absorption levels may then be used to control the generation of RF energy to provide balanced cooking of the food product. Feedback indicative of absorption levels is not necessarily employed in all embodiments however. For example, some embodiments may employ algorithms for selecting frequency and phase based on pre-determined strategies identified for particular combinations of selected cook times, power levels, food types, recipes and/or the like. In some embodiments, the antenna assembly 130 may include multiple antennas, waveguides, launchers, and RF transparent coverings that provide an interface between the antenna assembly 130 and the cooking chamber 102. Thus, for example, four waveguides may be provided and, in some cases, each waveguide may receive RF energy generated by its own respective power module or power amplifier of the RF generator 204 operating under the control of control electronics 220. In an alternative embodiment, a single multiplexed generator may be employed to deliver different energy into each waveguide or to pairs of waveguides to provide energy into the cooking chamber 102.

In an example embodiment, the second energy source 210 may be an energy source capable of inducing browning and/or convective heating of the food product. Thus, for example, the second energy source 210 may a convection heating system including an airflow generator 212 and an air heater 214. The airflow generator 212 may be embodied as or include the heated-air circulation fan or another device capable of driving airflow through the cooking chamber 102 (e.g., via the air delivery orifices 112). The air heater 214 may be an electrical heating element or other type of heater that heats air to be driven toward the food product by the airflow generator 212. Both the temperature of the air and the speed of airflow will impact cooking times that are achieved using the second energy source 210, and more particularly using the combination of the first and second energy sources 200 and 210.

In an example embodiment, the first and second energy sources 200 and 210 may be controlled, either directly or indirectly, by the control electronics 220. The control electronics 220 may be configured to receive inputs descriptive of the selected recipe, food product and/or cooking conditions in order to provide instructions or controls to the first and second energy sources 200 and 210 to control the cooking process. In some embodiments, the control electronics 220 may be configured to receive static and/or dynamic inputs regarding the food product and/or cooking conditions. Dynamic inputs may include feedback data regarding phase and frequency of the RF energy applied to the cooking chamber 102. In some cases, dynamic inputs may include adjustments made by the operator during the cooking process. The static inputs may include parameters that are input by the operator as initial conditions. For example, the static inputs may include a description of the food type, initial state or temperature, final desired state or temperature, a number and/or size of portions to be cooked, a location of the item to be cooked (e.g., when multiple trays or levels are employed), a selection of a recipe (e.g., defining a series of cooking steps) and/or the like.

In some embodiments, the control electronics 220 may be configured to also provide instructions or controls to the airflow generator 212 and/or the air heater 214 to control airflow through the cooking chamber 102. However, rather than simply relying upon the control of the airflow generator 212 to impact characteristics of airflow in the cooking chamber 102, some example embodiments may further employ the first energy source 200 to also apply energy for cooking the food product so that a balance or management of the amount of energy applied by each of the sources is managed by the control electronics 220.

In an example embodiment, the control electronics 220 may be configured to access algorithms and/or data tables that define RF cooking parameters used to drive the RF generator 204 to generate RF energy at corresponding levels, phases and/or frequencies for corresponding times determined by the algorithms or data tables based on initial condition information descriptive of the food product and/or based on recipes defining sequences of cooking steps. As such, the control electronics 220 may be configured to employ RF cooking as a primary energy source for cooking the food product, while the convective heat application is a secondary energy source for browning and faster cooking. However, other energy sources (e.g., tertiary or other energy sources) may also be employed in the cooking process.

In some cases, cooking signatures, programs or recipes may be provided to define the cooking parameters to be employed for each of multiple potential cooking stages or steps that may be defined for the food product and the control electronics 220 may be configured to access and/or execute the cooking signatures, programs or recipes (all of which may generally be referred to herein as recipes). In some embodiments, the control electronics 220 may be configured to determine which recipe to execute based on inputs provided by the user except to the extent that dynamic inputs (i.e., changes to cooking parameters while a program is already being executed) are provided. In an example embodiment, an input to the control electronics 220 may also include browning instructions. In this regard, for example, the browning instructions may include instructions regarding the air speed, air temperature and/or time of application of a set air speed and temperature combination (e.g., start and stop times for certain speed and heating combinations). The browning instructions may be provided via a user interface accessible to the operator, or may be part of the cooking signatures, programs or recipes.

As discussed above, the first air circulation system may be configured to drive heated air through the cooking chamber 102 to maintain a steady cooking temperature within the cooking chamber 102. Meanwhile, the second air circulation system may cool the control electronics 220. The first and second air circulation systems may be isolated from each other. However, each respective system generally uses differential pressures (e.g., created by fans) within various compartments formed in the respective systems to drive the corresponding air flows needed for each system. While the airflow of the first air circulation system is aimed at heating food in the cooking chamber 102, the airflow of the second air circulation system is aimed at cooling the control electronics 220. As such, cooling fan 290 provides cooling air 295 to the control electronics 220, as shown in FIG. 2.

The structures that form the air cooling pathways via which the cooling fan 290 cools the control electronics 220 may be designed to provide efficient delivery of the cooling air 295 to the control electronics 220, but also minimize fouling issues or dust/debris buildup in sensitive areas of the oven 100, or areas that are difficult to access and/or clean. Meanwhile, the structures that form the air cooling pathways may also be designed to maximize the ability to access and clean the areas that are more susceptible to dust/debris buildup. Furthermore, the structures that form the air cooling pathways via which the cooling fan 290 cools the control electronics 220 may be designed to strategically employ various natural phenomena to further facilitate efficient and effective operation of the second air circulation system. In this regard, for example, the tendency of hot air to rise, and the management of high pressure and low pressure zones necessarily created by the operation of fans within the system may each be employed strategically by the design and placement of various structures to keep certain areas that are hard to access relatively clean and other areas that are otherwise relatively easy to access more likely to be places where cleaning is needed.

Figure 3:
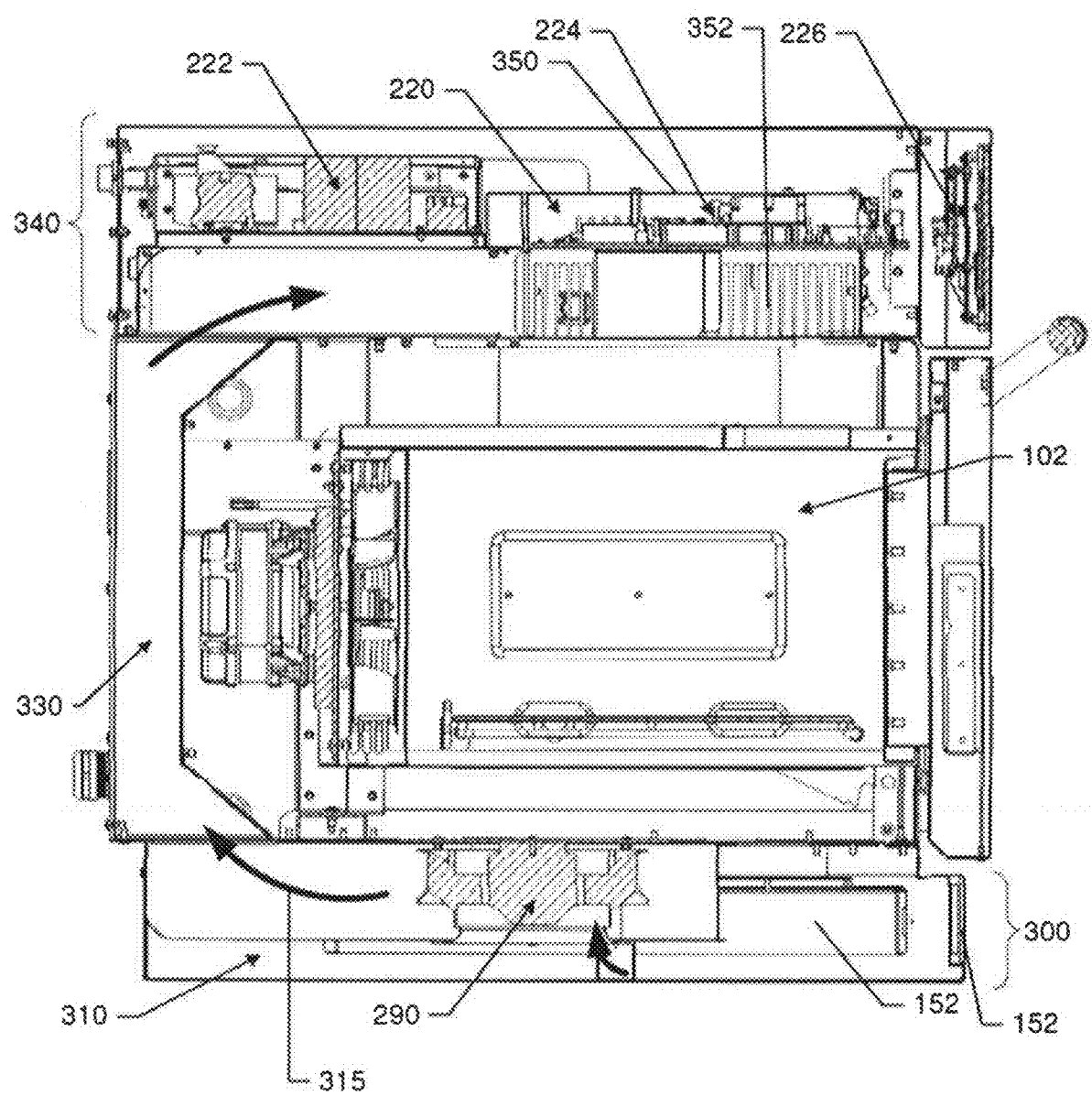
FIG. 3 shows a cross sectional view of the oven from a plane passing from the front to the back of the oven according to an example embodiment.

The typical airflow path, and various structures of the second air circulation system, can be seen in FIG. 3. In this regard, FIG. 3 shows a cross sectional view of the oven 100 from a plane passing from the front to the back of the oven 100. The basement (or basement region 300) of the oven 100 is defined below the cooking chamber 102, and includes an inlet cavity 310. During operation, air is drawn into the inlet cavity 310 through the inlet array 152 and is further drawn into the cooling fan 290 before being forced radially outward (as shown by arrow 315) away from the cooling fan 290 into a riser duct 330 (e.g., a chimney) that extends from the basement region 300 to the attic (or attic region 340) to turn air upward (as shown by arrow 315). Air is forced upward through the riser duct 330 into the attic region 340, which is where components of the control electronics 220 are disposed. The air then cools the components of the control electronics 220 before exiting the body 150 of the oven 100 via the outlet louvers 154. The components of the control electronics 220 may include power supply electronics 222, power amplifier electronics 224 and display electronics 226.

Upon arrival of air into the attic region 340, the air is initially guided from the riser duct 330 to a power amplifier casing 350. The power amplifier casing 350 may house the power amplifier electronics 224. In particular, the power amplifier electronics 224 may sit on an electronic board to which all such components are mounted. The power amplifier electronics 224 may therefore include one or more power amplifiers that are mounted to the electronic board for powering the antenna assembly 130. Thus, the power amplifier electronics 224 may generate a relatively large heat load. To facilitate dissipation of this relatively large heat load, the power amplifier electronics 224 may be mounted to one or more heat sinks 352. In other words, the electronic board may be mounted to the one or more heat sinks 352. The heat sinks 352 may include large metallic fins that extend away from the circuit board to which the power amplifier electronics 224 are mounted. Thus, the fins may extend downwardly (toward the cooking chamber 102). The fins may also extend in a transverse direction away from a centerline (from front to back) of the oven 100 to guide air provided into the power amplifier casing 350 and past the fins of the heat sinks 352.

Figure 4:
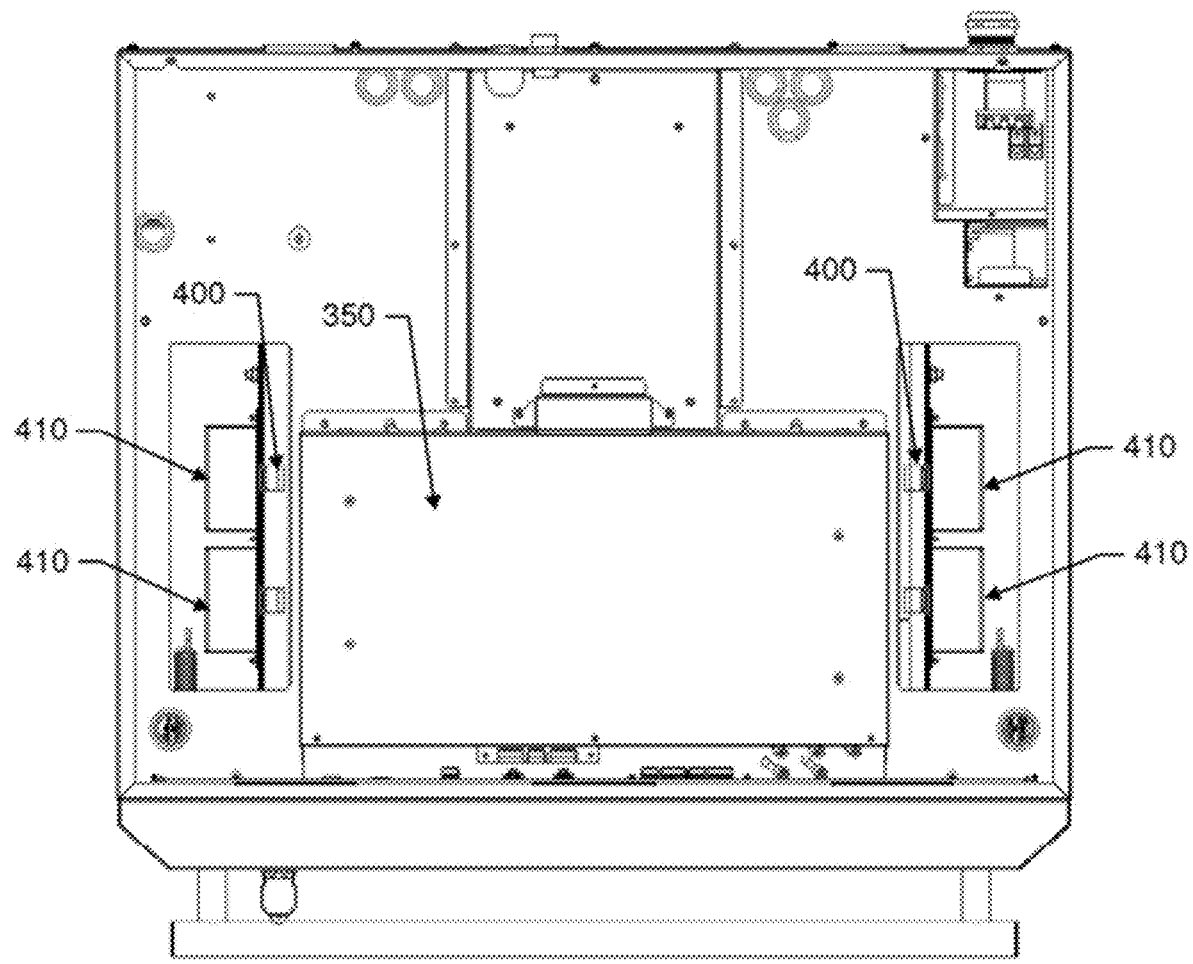
FIG. 4 is a top view of an attic region of the oven in accordance with an example embodiment.

FIG. 4 illustrates a top view of the attic region 340, and shows the power amplifier casing 350 and various components of the antenna assembly 130 including a launcher assembly 400 and waveguides of a waveguide assembly 410. Power is provided from the power amplifier electronics 224 to each launcher of the launcher assembly 400. The launcher assembly 400 operably couples a signal generated by the power amplifiers of the power amplifier electronics 224 into a corresponding one of the waveguides of the waveguide assembly 410 for communication of the corresponding signal into the cooking chamber 102 via the antenna assembly 130 as described above.

The power amplifier electronics 224 are defined by a plurality of electronic circuitry components including opamps, transistors and/or the like that are configured to generate waveforms at the corresponding power levels, frequencies and phases that are desired for a particular situation or cooking program. In some cases, the cooking program may select an algorithm for control of the power amplifier electronics 224 to direct RF emissions into the cooking chamber 102 at selected power levels, frequencies and phases. One or more learning processes may be initiated to select one or more corresponding algorithms to guide the power application. The learning processes may include detection of feedback on the efficacy of the application of power at specific frequencies (and/or phases) into the cooking chamber 102. In order to determine the efficacy, in some cases, the learning processes may measure efficiency and compare the efficiency to one or more thresholds. Efficiency may be calculated as the difference between forward power ($P_{fwd}$) and reflected power (Pith), divided by the forward power ($P_{fwd}$). As such, for example, the power inserted into the cooking chamber 102 (i.e., the forward power) may be measured along with the reflected power to determine the amount of power absorbed in the food product (or workload) inserted in the cooking chamber 102. The efficiency may then be calculated as: Efficiency (elf)=($P_{fwd}$−$P_{refl}$)/$P_{fwd}$.

As can be appreciated from the description above, the measurement of the efficiency of the delivery of RF energy to the food product may be useful in determining how effective a particular (e.g., a current) selection for a combination (or pair) of frequency and phase parameters of RF energy applied into the cooking chamber 102 is at delivering heat energy to the food product. Thus, the measurement of efficiency may be useful for selecting the best combination or algorithm for application of energy. The measurement of efficiency should therefore also desirably be as accurate as possible in order to ensure that meaningful control is affected by monitoring efficiency.

Figure 5:
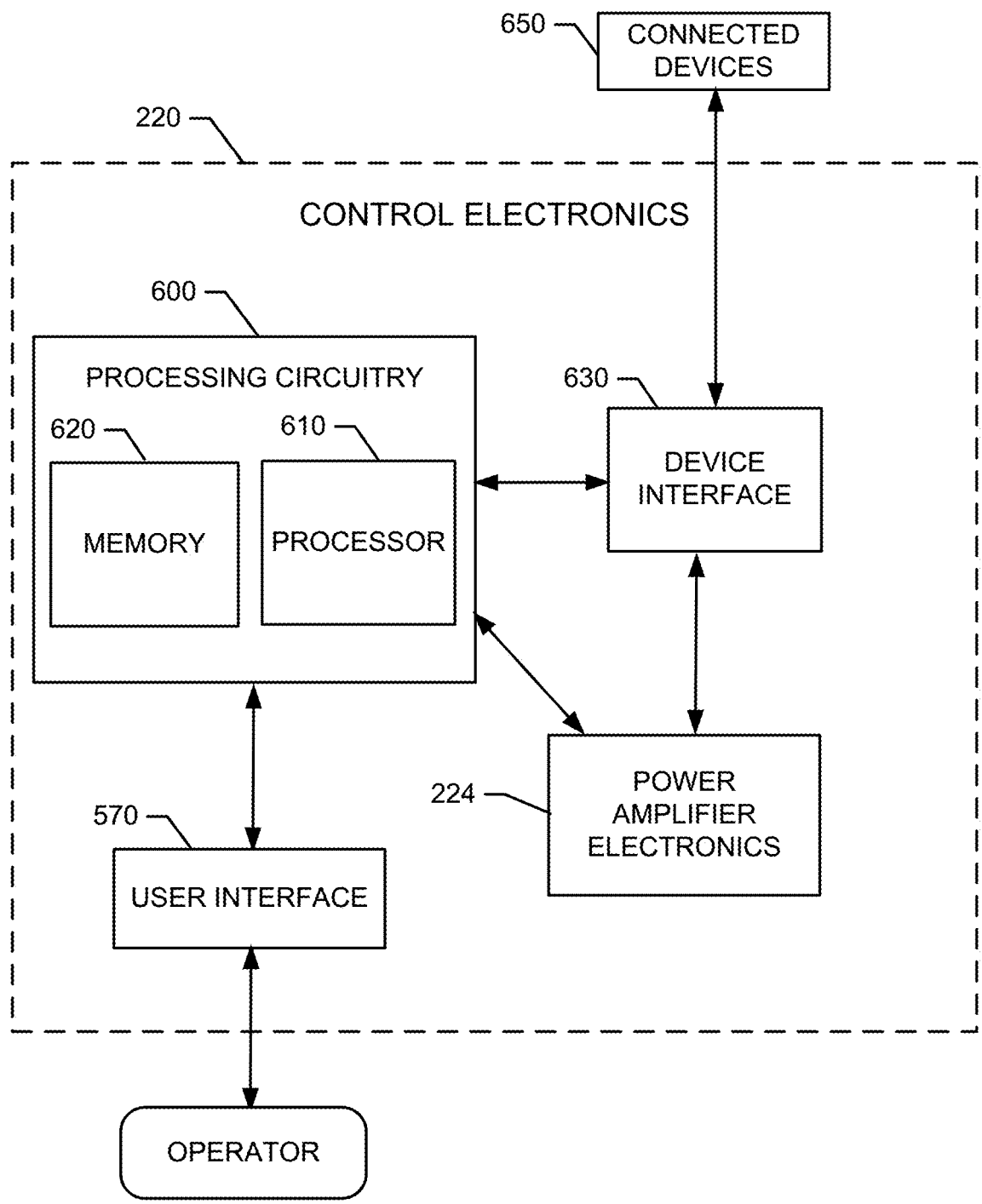
FIG. 5 is a block diagram of control electronics for providing the electronic circuitry for controlling RF application in the oven in accordance with an example embodiment.

FIG. 5 is a block diagram of control electronics 220 for providing the electronic circuitry for instantiation of power cycling during oven operation in accordance with an example embodiment. In some embodiments, the control electronics 220 may include or otherwise be in communication with processing circuitry 600 that is configurable to perform actions in accordance with example embodiments described herein. As such, for example, the functions attributable to the control electronics 220 may be carried out by the processing circuitry 600.

The processing circuitry 600 may be configured to perform data processing, control function execution and/or other processing and management services according to an example embodiment of the present invention. In some embodiments, the processing circuitry 600 may be embodied as a chip or chip set. In other words, the processing circuitry 600 may comprise one or more physical packages (e.g., chips) including materials, components and/or wires on a structural assembly (e.g., a baseboard). The structural assembly may provide physical strength, conservation of size, and/or limitation of electrical interaction for component circuitry included thereon. The processing circuitry 600 may therefore, in some cases, be configured to implement an embodiment of the present invention on a single chip or as a single "system on a chip." As such, in some cases, a chip or chipset may constitute means for performing one or more operations for providing the functionalities described herein.

In an example embodiment, the processing circuitry 600 may include one or more instances of each of a processor 610 and memory 620 that may be in communication with or otherwise control a device interface 630 and the user interface 570. As such, the processing circuitry 600 may be embodied as a circuit chip (e.g., an integrated circuit chip) configured (e.g., with hardware, software or a combination of hardware and software) to perform operations described herein. However, in some embodiments, the processing circuitry 600 may be embodied as a portion of an on-board computer.

The user interface 570 (which may be embodied as, include, or be a portion of the interface panel 106) may be in communication with the processing circuitry 600 to receive an indication of a user input at the user interface 570 and/or to provide an audible, visual, mechanical or other output to the user (or operator). As such, the user interface 570 may include, for example, a display (e.g., a touch screen such as the interface panel 106), one or more hard or soft buttons or keys, and/or other input/output mechanisms.

The device interface 630 may include one or more interface mechanisms for enabling communication with connected devices 650 such as, for example, other components of the oven 100, sensors of a sensor network of the oven 100, removable memory devices, wireless or wired network communication devices, and/or the like. In some cases, the device interface 630 may be any means such as a device or circuitry embodied in either hardware, or a combination of hardware and software that is configured to receive and/or transmit data from/to sensors that measure any of a plurality of device parameters such as frequency, phase, temperature (e.g., in the cooking chamber 102 or in air passages associated with the second energy source 210), air speed, and/or the like. As such, in one example, the device interface 630 may receive input at least from a temperature sensor that measures the temperatures described above, or receives input from any of the other parameters described above, in order to enable communication of such parameters to the processing circuitry 600 for the performance of certain protective or control functions. Alternatively or additionally, the device interface 630 may provide interface mechanisms for any devices capable of wired or wireless communication with the processing circuitry 600. In still other alternatives, the device interface 630 may provide connections and/or interface mechanisms to enable the processing circuitry 600 to control the various components of the oven 100.

In an exemplary embodiment, the memory 620 may include one or more non-transitory memory devices such as, for example, volatile and/or non-volatile memory that may be either fixed or removable. The memory 620 may be configured to store information, data, cooking signatures, programs, recipes, applications, instructions or the like for enabling the control electronics 220 to carry out various functions in accordance with example embodiments of the present invention. For example, the memory 620 could be configured to buffer input data for processing by the processor 610. Additionally or alternatively, the memory 620 could be configured to store instructions for execution by the processor 610. As yet another alternative, the memory 620 may include one or more databases that may store a variety of data sets responsive to input from the sensor network, or responsive to programming of any of various cooking programs. Among the contents of the memory 620, applications may be stored for execution by the processor 610 in order to carry out the functionality associated with each respective application. In some cases, the applications may include control applications that utilize parametric data to control the application of heat by the first and second energy sources 200 and 210 as described herein. In this regard, for example, the applications may include operational guidelines defining expected cooking speeds for given initial parameters (e.g., food type, size, initial state, location, and/or the like) using corresponding tables of frequencies, phases, RF energy levels, temperatures and air speeds. Thus, some applications that may be executable by the processor 610 and stored in memory 620 may include tables defining combinations of RF energy parameters and air speed and temperature to determine cooking times for certain levels of doneness and/or for the execution of specific cooking recipes. Accordingly, different cooking programs can be executed to generate different RF and/or convective environments to achieve the desired cooking results. In still other examples, data tables may be stored to define calibration values and/or diagnostic values, as described above. Alternatively or additionally, the memory 620 may store applications for defining responses to stimuli including the generation of protective actions and/or notification functions.

The processor 610 may be embodied in a number of different ways. For example, the processor 610 may be embodied as various processing means such as one or more of a microprocessor or other processing element, a coprocessor, a controller or various other computing or processing devices including integrated circuits such as, for example, an ASIC (application specific integrated circuit), an FPGA (field programmable gate array), or the like. In an example embodiment, the processor 610 may be configured to execute instructions stored in the memory 620 or otherwise accessible to the processor 610. As such, whether configured by hardware or by a combination of hardware and software, the processor 610 may represent an entity (e.g., physically embodied in circuitry—such as in the form of processing circuitry 600) capable of performing operations according to example embodiments of the present invention while configured accordingly. Thus, for example, when any instance of the processor 610 is embodied as an ASIC, FPGA or the like, the processor 610 may be specifically configured hardware for conducting the operations described herein. Alternatively, as another example, when the processor 610 is embodied as one or more executors of software instructions, the instructions may specifically configure the processor 610 to perform the operations described herein.

In an example embodiment, the processor 610 (or the processing circuitry 600) may be embodied as, include or otherwise control the control electronics 220 and/or the power amplifier electronics 224. As such, in some embodiments, the processor 610 (or the processing circuitry 600) may be said to cause each of the operations described in connection with the control electronics 220 and/or the power amplifier electronics 224 by directing the control electronics 220 and/or the power amplifier electronics 224, respectively, to undertake the corresponding functionalities responsive to execution of instructions or algorithms configuring the processor 610 (or processing circuitry 600) accordingly. As an example, the control electronics 220 may be configured to control the responses to various stimuli associated with executing the learning procedure discussed above and directing RF application within the oven 100 based on the learning procedure. Moreover, the control electronics 220 may be configured to determine efficiency parameters and take protective actions based on the efficiency parameters, or based on individual ones of the values, measurements and/or parameters that are determined by or received at the control electronics 220 for execution of the learning procedure. In some cases, a separate instance of a processor (or processors) and memory may be associated with different parts of the control electronics 220 (e.g., including separate processors for the control of the power amplifier electronics 224 amongst potentially others).

In an example embodiment, the control electronics 220 may also access and/or execute instructions for control of the RF generator 204 and/or the antenna assembly 130 to control the application of RF energy to the cooking chamber 102. Thus, for example, the operator may provide static inputs to define the type, mass, quantity, or other descriptive parameters (e.g., a recipe) related to the food product(s) disposed within the cooking chamber 102. The control electronics 220 may then utilize the static inputs to locate an algorithm or other program for execution to define the application of RF energy and/or convective energy to be applied within the cooking chamber 102. The control electronics 220 may also monitor dynamic inputs to modify the amount, frequency, phase or other characteristics of the RF energy to be applied within the cooking chamber 102 during the cooking process, and may also perform protective functions. Finally, the control electronics 220 may execute instructions for calibration and/or fault analysis. Accordingly, for example, the control electronics 220 may be configured to act locally to protect the power amplifier electronics 224 via stopping RF application to the cooking chamber 102, via making adjustments to components to provide calibrated outputs, and/or via alerting the user when various abnormal or correctable situations are detected.

In some embodiments, efficiency calculations may be made periodically throughout the cooking process as part of a learning process. In this regard, the control electronics 220 may be configured to extrapolate, calculate or otherwise determine the amount of energy to be directed into food product (i.e., forward power value 520), and the amount of energy reflected back from the cooking chamber 102 (i.e., the reflected power value 522) so that an accurate estimate of the absorbed power (or energy) can be estimated, and the efficiency parameter can be determined. The control electronics 220 may then control operation of the RF generator 204 and/or the antenna assembly 130 based on the measured efficiency as part of a calibration or cooking process. Thus, for example, if a learning process is performed during cooking, the measured efficiency may be expected to be at least above a threshold value (e.g., 40%) whenever there is a food product or load in the cooking chamber 102. If efficiency is below the threshold value, the control electronics 220 may communicate with the user interface 570 to let the user know to check the cooking chamber 102 to make sure that there is a load therein. Discrete efficiency measurements may be made at any desirable interval (e.g., every 100 msec) to perform the protective or alert functions described herein. If reflected power is very high, the power amplifier electronics 224 may be shutdown. If certain temperatures of components (e.g., one or both of the heat sinks 352, the processor 610, or air temperatures) are too high, an alarm may be provided through the user interface 570 and/or the power amplifier electronics 224 may be shutdown. Other protective actions are also possible.

One aspect of the oven 100 of example embodiments that enables the oven 100 to provide an improvement in cooking capability is therefore the fact that the power amplifier electronics 224 employ the learning procedure described above. The learning procedure may be performed and then followed by the application of RF energy at amplitudes, phases and/or frequencies that are selected based on the most efficient combinations learned from the learning procedure. This process can be cyclic in that the learning procedure can be repeated several times during a cooking operation in order to ensure maximum efficiency as properties of the food product change due to cooking. Accordingly, power levels may cycle between high and lower levels during the learning/cooking cycles. As noted above, these cycles between high and low powers can generate thermal stresses on components of the power amplifier electronics 224.

Figure 6:
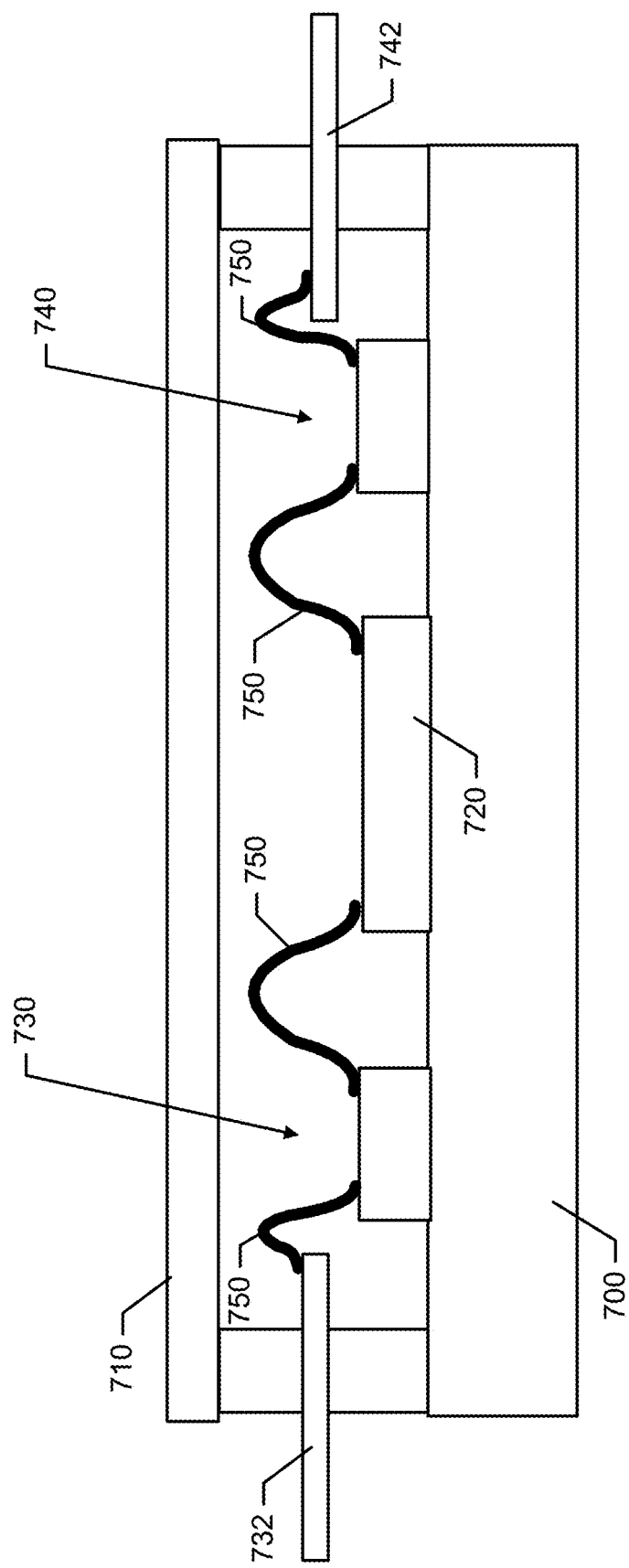
FIG. 6 illustrates a partially isolated cross section view through a package of power amplifier electronics of the oven in accordance with an example embodiment.

FIG. 6 illustrates a partially isolated cross section view taken through a portion of the power amplifier electronics 224 of FIG. 3. As shown in FIG. 6, a package/flange 700 may be operably coupled to a cover 710 to enclose or house a semiconductor die 720. The semiconductor die 720 may be a block of semiconducting material on which at least a portion of the functional circuit that forms or is a part of the power amplifier electronics 224 is fabricated. In an example embodiment, the semiconductor die 720 may include one or more instances or high power transistor components associated with RF or microwave frequency signal amplification. Examples of such high power transistor components include laterally diffused metal oxide semiconductor (LDMOS) RF power transistors and Galium Nitride (GaN) RF power transistors. These types of RF power transistors generally operate with very low drain/collector load impedances (e.g., about 0.5Ω to about 5Ω), and these low load impedances are generally required by optimal power matching rules. In order to match these low load impedances to the nominal characteristic impedance values of other system components to which the RF power transistors are operably coupled, some of which impedances may be in the range of about 50Ω to about 75Ω, impedance transformation networks may be employed.

In the example of FIG. 6, an input matching network 730 is operably coupled to an input tab 732, which extends out of the cover 710 to engage other components of the power amplifier electronics 224 and/or the oven 100. Meanwhile, an output matching network 740 is operably coupled to an output tab 742, which extends out of the cover 710 to engage other components of the power amplifier electronics 224 and/or the oven 100. The external circuitry to which the input tab 732 and/or output tab 742 connect may include one or more printed circuit boards made by high frequency materials and some passive components mounted on the printed circuit boards.

Each of the input and output matching networks 730 and 740 may include circuitry used to form the corresponding impedance transformation networks, and bonding wires 750. Respective instances of the bonding wires 750 may operably couple the input tab 732 to the circuitry used to form the impedance transformation network of the input matching network 730, couple the circuitry used to form the impedance transformation network of the input matching network 730 to the semiconductor die 720, couple the semiconductor die 720 to the circuitry used to form the impedance transformation network of the output matching network 740, and couple the circuitry used to form the impedance transformation network of the output matching network 740 to the output tab 742, respectively.

The bonding wires 750 may be arrayed in parallel with each other. Thus, it should be understood that the view of FIG. 6 only shows one such wire in each instance or grouping of bonding wires 750. Many other individual wires may be formed in series with the depicted wires. The bonding wires 750 may each be formed to include an arcuate section extending out of a plane forming a top surface of both the semiconductor die 720 and the input and output matching networks 730 and 740. Terminal ends of the bonding wires 750 may extend away from the arcuate section to either lie substantially flat on pads at which they are bonded, or form a substantially perpendicular intersection with the pads. In either case, the terminal ends may then be bonded using wedge or ball bonding techniques, respectively. The existence of the arcuate section may ensure that the bonding wire 750 must be longer than the distance between the semiconductor die 720 and a die on which the input or output matching network 730 or 740 is fabricated. In some cases, the length of the bonding wire 750 may be at least 1.5 times the distance between the semiconductor die 720 and the die on which the input or output matching network 730 or 740 is fabricated. However, other lengths (shorter or longer) are possible in some cases.

Generally, the higher the power and working frequencies used in an RF application, the better it is to develop a first step of the output matching network 740 in close physical proximity to the drain/collector of the semiconductor die 720. This goal of achieving a close physical proximity is aimed at improving either the efficiency of the power amplifier (e.g., for optimal use of DC power, heat dissipation reduction, lower junction temperatures and increased device reliability) or the application bandwidth and complexity (e.g., size and number of components) of other steps of the output matching network 740, which may be added external to the cover 710 of the package in order to reach the nominal characteristic impedance in the range of about 50Ω to about 75Ω.

The first step of the output matching network 740 (aimed either to impedance transformation or reactance compensation) may typically be inside the package of the high power transistor of the RF power amplifier. The input matching network 730 may work with a limited stress level. Accordingly, typical geometry and materials can withstand the worst case conditions of the device without creating reliability issues. Thus, it should be appreciated at this point that the output matching network 740, and particularly the bonding wires 750 that are employed in connection to the output matching network 740, becomes the limiting component relative to worst case working conditions. In particular, the thermal stresses on the bonding wires 750 that are operably coupled to the output matching network 740 are generally highest when power cycling between high and low powers occurs within the RF power amplifier.

The output matching network 740 is generally configured to operably couple an output of the semiconductor die 720 (i.e., a drain or collector of the active device developed inside the semiconductor die 720) to the output tab 742. The output matching network 740 may also be configured to provide compensation (e.g., in a first stage partial reduction) of the capacitive reactance of the active device formed in the semiconductor die 720. This capacitive reactance may be associated with an equivalent drain-source or collector-emitter capacitance. The compensation provided by this first stage partial reduction may be required to reduce the complexity of the further impedance transformation steps that are employed. The output matching network 740 may also be configured to provide a first step of impedance transformation. The first step of the impedance transformation may be required to reduce the total number of steps (e.g., the overall size and number of passive components) of any external output matching circuit. The output matching network 740 may include passive devices (e.g., capacitors such as ceramic capacitors or MOScaps (metal oxide semiconductor capacitors)) and connecting wires (e.g., including the bonding wires 750). When MOScaps are employed, the capacitors may either be made by separate sections of semiconductor (e.g., such that the input matching network 730 and output matching network 740 each have their own corresponding semiconductor die as shown by the rectangular blocks associated with each in FIG. 6) or may be embedded in the die along with the active device section (e.g., such that the RF power transistor and the MOScap are both diffused in the same semiconductor die (i.e., semiconductor die 720)). In either case, bonding wires 750 may be required to develop a proper topology for the impedance matching network.

As can be appreciated from the discussion above, the output matching network 740 is configured to operate at very low impedances and very high power levels. Thus, the output matching network 740 can be expected to experience very high current values at its interconnections with other components. The wired connections (e.g., the bonding wires 750) may therefore be expected to experience very high levels or RF/microwave current. The skin effect, which enables RF/microwave currents to flow only (or primarily) on the surface of connecting wires such as the bonding wires 750, may cause high thermal stresses to be experienced. In this regard, the connecting wires (e.g., the bonding wires 750) need to be configured to withstand huge stresses in terms of current density and/or working temperatures.

For continuous waveform (CW) applications or long pulse applications, maximum RF powers are experienced for a relatively long time. In any case, the periods of time during which such RF powers are experienced are longer than the time constant of the semiconductor die 720 and flange/package 700 of the device. This can cause high temperatures to build within wire sections such as the bonding wires 750. High values of wire temperature can significantly reduce the wire sections reliability due to a number or phenomena. For example, electro-migration phenomenon and bonding failure may each reduce reliability. Electro-migration phenomenon may occur when current density is very high along with temperature, and the phenomenon may affect the wires by reducing strength until, particularly in weaker sections of the wires, failure may occur.

Terminations (e.g., longitudinal ends) of wires are typically bonded to the components they connect. For example, the bonding wires 750 for the output matching network 740 are typically bonded to a pad at the drain/collector on the semiconductor die 720 at one end thereof, and bonded to the output matching network 740 at the other end thereof. The bonding joint may be a point of weakness during power cycling (e.g., for long pulse modulation, where power is cycled at a low rate with a repetition period of more than 100 msec) with a high difference in temperature between the high power operating condition (i.e., the on-condition), and low power operating condition (e.g., off-condition). Additionally, the learning procedure described above should be understood to qualify as a condition that cycles power to a low level before power returns to a high level after the learning process is completed. This temperature cycling induced by power cycling can cause bonding terminals to be mechanically stressed to the point of fatigue failure. The same effect can occur at bent sections of the bonding wires 750.

Figure 7:
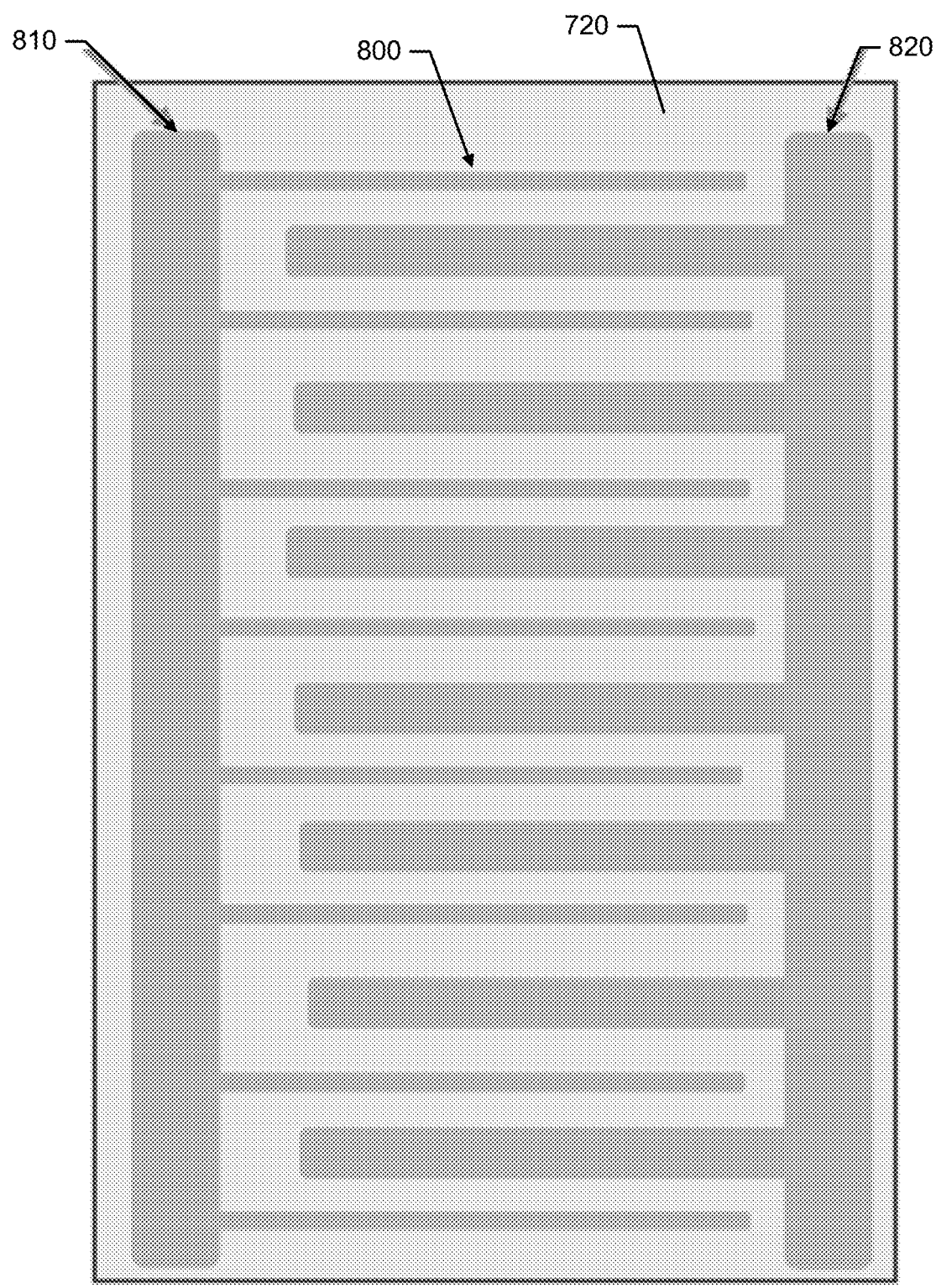
FIG. 7 is a plan view of a transistor array of a semiconductor die in accordance with an example embodiment.

FIG. 7 illustrates a plan view of a high power RF/microwave transistor die (e.g., semiconductor die 720) that includes multiple transistor cells (e.g., an array 800 of transistor cells) working in parallel. The semiconductor die 720 includes a gate/base (input) rail 810 and a drain/collector (output) rail 820 disposed on opposite sides of the array 800. One instance of the bonding wires 750 may be bonded to the gate/base (input) rail 810 and also be bonded to the input matching network 730. Another instance of the bonding wires 750 may be bonded to the drain/collector (output) rail 820 and also be bonded to the output matching network 740. In an example embodiment, the bond joint may be formed at the terminal ends of the bonding wires 750 via either wedge bonding or ball bonding. Wedge bonding may include bonding of the terminal end of the wire as the wire extends parallel to a surface of the pad (e.g., at the drain/collector (output) rail) to form a horizontal bond. Ball bonding may include bonding of the terminal end of the wire as the wire extends substantially perpendicular to the surface of the pad to form a vertical bond. Wedge bonding generally provides a lower footprint, and ball bonding generally provides a larger footprint.

For a typical RF/microwave power LDMOS or GaN device, wired connections between internal sections and toward interface tabs may be employed. In conventional devices, thin metal wires are used as the bonding wires 750. The thin metal wires may have a diameter that ranges from about 10 microns up to about 100 microns. The material used to form the thin metal wires is normally an aluminum alloy (e.g., an Aluminum-Silicon alloy with about 1% Silicon content), or a corrosion resistance variant with some Nickel. Due to the die structure, which generally includes an array of devices on the same die, the high overall RF and DC current values that are involved, and the geometry of the output rail (e.g., drain/collector (output) rail 820) on the die may result in the use of multiple thin wires to try to limit the stress of the connection section. The higher the frequency, the thinner the wire that should generally be used. Meanwhile, higher power means higher DC or RF current. Given the high power levels at higher frequencies, and the corresponding power cycling that occurs for RF cooking associated with the oven 100 described herein, the reliability limits of the typical wire bonding techniques described above can easily be reached and reliability margins can be overcome. Accordingly, the typical aluminum alloy-based materials, even in the best alloy formations, have proven to have limited ruggedness in a power cycling environment where large power swings are possible. This behavior strongly limits the capability to develop or use high power RF/microwave LDMOS or GaN transistors in power cycling uses where conventional bonding wires and techniques are employed.

To improve the reliability and performance of the RF power amplifier of the power amplifier electronics 224 of the oven 100 of example embodiments, the semiconductor die 720 may be operably coupled to the output matching network 740, via the bonding wires 750 being embodied as copper bonding wires. Thus, for the semiconductor die 720 of example embodiments, which may be fabricated with LDMOS or GaN active devices thereon, thin copper wires instead of aluminum alloy wires may be employed to improve ruggedness in power cycling contexts instead of simply thickening the diameter of the wires. In this regard, merely thickening the diameter of the wires would, for the frequencies involved in the oven 100 of example embodiments, generally result in either poorer performance or at least no significant improvement in performance. Meanwhile, the employment of copper in the bonding wires 750 may demonstrate an improvement of about 5 to 20 times the number of cycles that can be endured without failure in fatigue tests involving high power cycling and high temperature changes. As such, the use of copper in the bonding wires 750 is critical to the performance of the high power RF amplifier that is used in a power cycling environment. Moreover, the use of copper in the bonding wires 750 enables higher RF power and power cycling resistance during driving while maintaining the same number and diameter of wires that would otherwise normally be employed. The copper bonding wires 750 provide an advantage of having a higher RF fuse current and lower thermal resistance with a higher melting point, thereby enabling use at higher temperatures. Additionally, compatibility issues with existing pad size and surface pad finishing (low intermetallic growth) may also enhance the value of copper bonding wires 750 as a candidate for further high power LDMOS and GaN transistor development at RF/microwave frequencies. The copper bonding wires 750 may be made of high purity copper, and may have stable mechanical properties and high reliability at their respective bonding joints. Thus, loop stability of the arcuate section may also be high, and the copper bonding wires 750 may experience significantly reduced formation of intermetallic phases. A reduced rate of intermetallic growth, lower resistance and lower heat generation in the copper bonding wires 750 (particularly relative to aluminum-based wires, but also relative to other metallic alloys) may result in lower increase in resistance over time and slower aging of the copper bonding wires 750. The useful life of the copper bonding wires 750 may therefore be increased, and the life of the corresponding RF power amplifier and ultimately the oven 100 may also be increased.

In an example embodiment, an oven may be provided. The oven may include a cooking chamber configured to receive a food product, and an RF heating system configured to provide RF energy into the cooking chamber using solid state electronic components. The solid state electronic components include power amplifier electronics configured to provide a signal into the cooking chamber via a launcher assembly operably coupled to the cooking chamber via a waveguide assembly. The power amplifier electronics may be configured to control application of RF energy into the cooking chamber at least in part based on a learning procedure that generates a power cycling between high and low powers when the learning procedure is executed. The power amplifier electronics may include a semiconductor die on which one or more RF power transistors are fabricated, an output matching network configured to provide impedance matching between the semiconductor die and external components operably coupled to an output tab, and bonding wires bonded at terminal ends thereof to operably couple the one or more RF power transistors of the semiconductor die to the output matching network. The bonding wires may include copper bonding wires having a diameter of between about 10 microns and about 100 microns.

In some embodiments, additional optional features may be included or the features described above may be modified or augmented. Each of the additional features, modification or augmentations may be practiced in combination with the features above and/or in combination with each other. Thus, some, all or none of the additional features, modification or augmentations may be utilized in some embodiments. For example, in some cases, the copper bonding wires may be formed to include an arcuate section extending out of a plane forming a top surface of both the semiconductor die and the output matching network. In some cases, the terminal ends of the copper bonding wires may be bent from the arcuate section to be substantially parallel to the top surface of each of the semiconductor die and the output matching network. In some cases, the terminal ends of the copper bonding wires may be bonded to a pad surface of an output rail of the semiconductor die and a pad surface of a die on which the output matching network is fabricated by wedge bonding. In an example embodiment, the terminal ends of the copper bonding wires may extend from the arcuate section to be substantially perpendicular to the top surface of each of the semiconductor die and the output matching network. In such an example, the terminal ends of the copper bonding wires may be bonded to a pad surface of an output rail of the semiconductor die and a pad surface of a die on which the output matching network is fabricated by ball bonding. In some cases, the copper bonding wires may have a length at least 1.5 times a distance between the semiconductor die and a die on which the output matching network is fabricated. In an example embodiment, the power amplifier electronics may further include an input matching network. An additional instance of the copper bonding wires may be provided between an input rail of the semiconductor die and a pad surface of a die on which the input matching network is fabricated. In some cases, additional respective instances of the copper bonding wires may be provided between an input tab of a package in which the semiconductor die is disposed and the die on which the input matching network is fabricated and between the output tab and the die on which the output matching network is fabricated. In an example embodiment, the output matching network may be configured to provide impedance matching between a drain/collector impedance of the semiconductor die to about a 50Ω to about 75Ω at the output tab.

Figure 8:
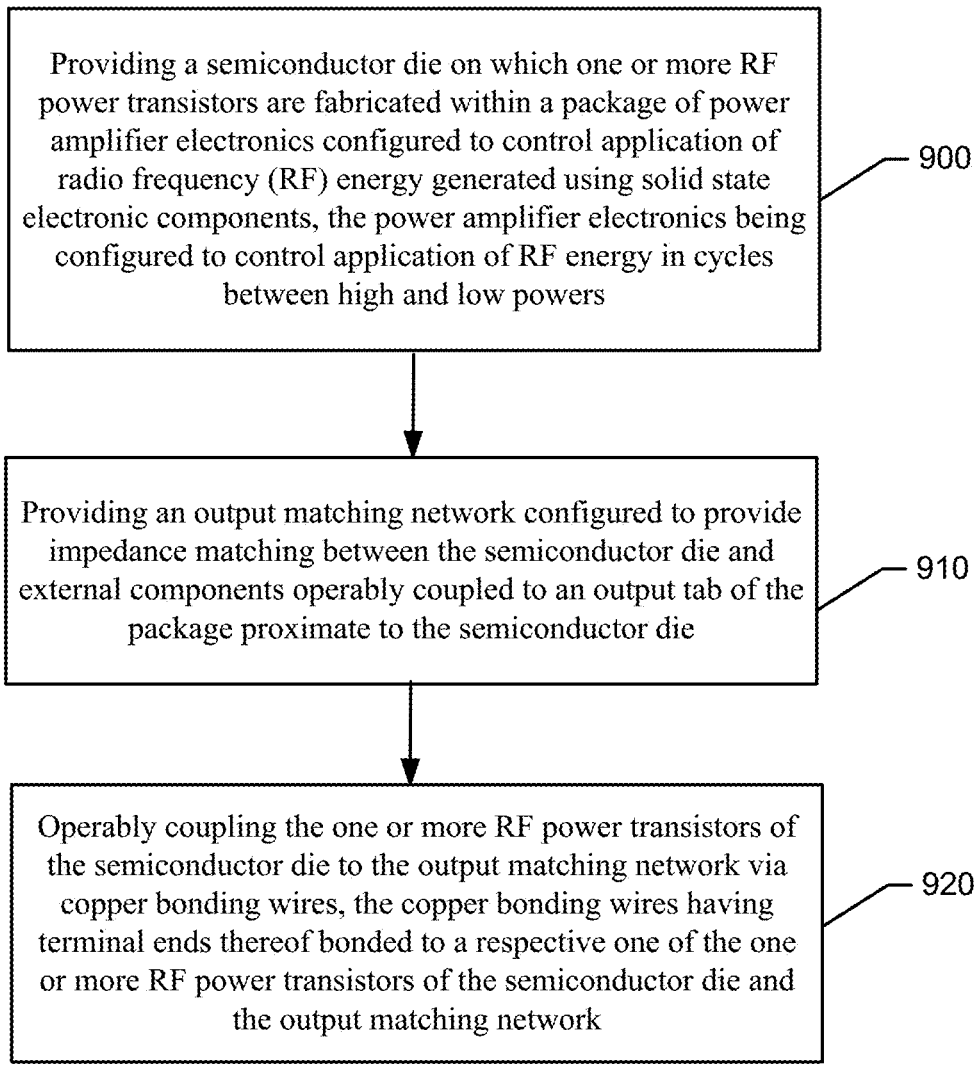
FIG. 8 illustrates a block diagram of a method of providing internal bonding within power amplifier electronics in accordance with an example embodiment.

FIG. 8. illustrates a block diagram of a method of providing internal bonding within power amplifier electronics in accordance with an example embodiment. As shown in FIG. 8, the method may include providing a semiconductor die on which one or more RF power transistors are fabricated within a package of power amplifier electronics configured to control application of radio frequency (RF) energy generated using solid state electronic components at operation 900. The power amplifier electronics may be configured to control application of RF energy in cycles between high and low powers. The method may further include providing an output matching network configured to provide impedance matching between the semiconductor die and external components operably coupled to an output tab of the package proximate to the semiconductor die at operation 910, and operably coupling the one or more RF power transistors of the semiconductor die to the output matching network via copper bonding wires at operation 920. The copper bonding wires may have terminal ends thereof that are bonded to a respective one of the one or more RF power transistors of the semiconductor die and the output matching network. The bonding wires may include copper bonding wires having a diameter of between about 10 microns and about 100 microns.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. In cases where advantages, benefits or solutions to problems are described herein, it should be appreciated that such advantages, benefits and/or solutions may be applicable to some example embodiments, but not necessarily all example embodiments. Thus, any advantages, benefits or solutions described herein should not be thought of as being critical, required or essential to all embodiments or to that which is claimed herein. Although specific terms are employed herein, they are used in a generic and descriptive sense only and not for purposes of limitation.

That which is claimed:

1. An oven comprising:
a cooking chamber configured to receive a food product; and
a radio frequency (RF) heating system configured to provide RF energy into the cooking chamber using solid state electronic components to heat the food product,
wherein the solid state electronic components include power amplifier electronics configured to provide a signal into the cooking chamber via a launcher assembly operably coupled to the cooking chamber via a waveguide assembly,
wherein the power amplifier electronics are configured to control application of RF energy into the cooking chamber at least in part based on a learning procedure that generates a power cycling between high and low powers when the learning procedure is executed,
wherein the power amplifier electronics include:
a semiconductor die on which one or more RF power transistors are fabricated,
an output matching network configured to provide impedance matching between the semiconductor die and external components operably coupled to an output tab, and
bonding wires bonded at terminal ends thereof to operably couple the one or more RF power transistors of the semiconductor die to the output matching network, and
wherein the bonding wires comprise copper bonding wires having a diameter of between about 10 microns and about 100 microns.

2. The oven of claim 1, wherein the copper bonding wires are formed to include an arcuate section extending out of a plane forming a top surface of both the semiconductor die and the output matching network.

3. The oven of claim 2, wherein the terminal ends of the copper bonding wires are bent from the arcuate section to be substantially parallel to the top surface of each of the semiconductor die and the output matching network.

4. The oven of claim 3, wherein the terminal ends of the copper bonding wires are bonded to a pad surface of an output rail of the semiconductor die and a pad surface of a die on which the output matching network is fabricated by wedge bonding.

5. The oven of claim 2, wherein the terminal ends of the copper bonding wires extend from the arcuate section to be substantially perpendicular to the top surface of each of the semiconductor die and the output matching network.

6. The oven of claim 5, wherein the terminal ends of the copper bonding wires are bonded to a pad surface of an output rail of the semiconductor die and a pad surface of a die on which the output matching network is fabricated by ball bonding.

7. The oven of claim 1, wherein the power amplifier electronics further comprise an input matching network, and
wherein an additional instance of the copper bonding wires is provided between an input rail of the semiconductor die and a pad surface of a die on which the input matching network is fabricated.

8. The oven of claim 7, wherein additional respective instances of the copper bonding wires are provided between an input tab of a package in which the semiconductor die is disposed and the die on which the input matching network is fabricated and between the output tab and a die on which the output matching network is fabricated.

9. The oven of claim 1, wherein the output matching network is configured to provide impedance matching between a drain/collector impedance of the semiconductor die to about a 50Ω to about 75Ω at the output tab.

10. Power amplifier electronics for controlling application of radio frequency (RF) energy generated using solid state electronic components, the power amplifier electronics being configured to control application of RF energy in cycles between high and low powers, the power amplifier electronics comprising:
a semiconductor die on which one or more RF power transistors are fabricated;
an output matching network configured to provide impedance matching between the semiconductor die and external components operably coupled to an output tab; and
bonding wires bonded at terminal ends thereof to operably couple the one or more RF power transistors of the semiconductor die to the output matching network;
wherein the bonding wires comprise copper bonding wires having a diameter of between about 10 microns and about 100 microns.

11. The power amplifier electronics of claim 10, wherein the copper bonding wires are formed to include an arcuate section extending out of a plane forming a top surface of both the semiconductor die and the output matching network.

12. The power amplifier electronics of claim 11, wherein the terminal ends of the copper bonding wires are bent from the arcuate section to be substantially parallel to the top surface of each of the semiconductor die and the output matching network.

13. The power amplifier electronics of claim 12, wherein the terminal ends of the copper bonding wires are bonded to a pad surface of an output rail of the semiconductor die and a pad surface of a die on which the output matching network is fabricated by wedge bonding.

14. The power amplifier electronics of claim 11, wherein the terminal ends of the copper bonding wires extend from the arcuate section to be substantially perpendicular to the top surface of each of the semiconductor die and the output matching network.

15. The power amplifier electronics of claim 14, wherein the terminal ends of the copper bonding wires are bonded to a pad surface of an output rail of the semiconductor die and a pad surface of a die on which the output matching network is fabricated by ball bonding.

16. The power amplifier electronics of claim 10, wherein the power amplifier electronics further comprise an input matching network, and
wherein an additional instance of the copper bonding wires is provided between an input rail of the semiconductor die and a pad surface of a die on which the input matching network is fabricated.

17. The power amplifier electronics of claim 16, wherein additional respective instances of the copper bonding wires are provided between an input tab of a package in which the semiconductor die is disposed and the die on which the input matching network is fabricated and between the output tab and the die on which the output matching network is fabricated.

18. The power amplifier electronics of claim 10, wherein the output matching network is configured to provide impedance matching between a drain/collector impedance of the semiconductor die to about a 50Ω to about 75Ω at the output tab.

19. A method of coupling components in power amplifier electronics, the method comprising:
providing a semiconductor die on which one or more RF power transistors are fabricated within a package of power amplifier electronics configured to control application of radio frequency (RF) energy generated using solid state electronic components, the power amplifier electronics being configured to control application of RF energy in cycles between high and low powers;
providing an output matching network configured to provide impedance matching between the semiconductor die and external components operably coupled to an output tab of the package proximate to the semiconductor die; and
operably coupling the one or more RF power transistors of the semiconductor die to the output matching network via copper bonding wires, the copper bonding wires having terminal ends thereof bonded to a respective one of the one or more RF power transistors of the semiconductor die and the output matching network,
wherein the bonding wires comprise copper bonding wires having a diameter of between about 10 microns and about 100 microns.

20. The method of claim 19, further comprising providing an input matching network and operably coupling an input rail of the semiconductor die and a pad surface of a die on which the input matching network is fabricated to each other via another instance of the copper bonding wires.

* * * * *